(12) United States Patent
Hirose

(10) Patent No.: US 9,338,932 B2
(45) Date of Patent: May 10, 2016

(54) MAGNETOPLUMBITE-TYPE HEXAGONAL FERRITE

(71) Applicant: KABUSHIKI KAISHA RIKEN, Tokyo (JP)

(72) Inventor: Keita Hirose, Kumagaya (JP)

(73) Assignee: KABUSHIKI KAISHA RIKEN, Tokyo (JP)

( * ) Notice: Subject to any disclaimer, the term of this patent is extended or adjusted under 35 U.S.C. 154(b) by 99 days.

(21) Appl. No.: 14/211,092

(22) Filed: Mar. 14, 2014

(65) Prior Publication Data

US 2014/0291571 A1    Oct. 2, 2014

(30) Foreign Application Priority Data

Mar. 29, 2013   (JP) ................................. 2013-073805

(51) Int. Cl.

| | |
|---|---|
| *H01F 1/11* | (2006.01) |
| *H05K 9/00* | (2006.01) |
| *C04B 35/26* | (2006.01) |
| *C01G 49/00* | (2006.01) |

(52) U.S. Cl.
CPC .......... *H05K 9/0081* (2013.01); *C01G 49/0009* (2013.01); *C04B 35/26* (2013.01); *H01F 1/11* (2013.01); *C04B 2235/3206* (2013.01); *C04B 2235/3208* (2013.01); *C04B 2235/3213* (2013.01); *C04B 2235/3215* (2013.01); *C04B 2235/3224* (2013.01); *C04B 2235/3227* (2013.01); *C04B 2235/3232* (2013.01); *C04B 2235/3244* (2013.01); *C04B 2235/3262* (2013.01); *C04B 2235/3275* (2013.01); *C04B 2235/3281* (2013.01); *C04B 2235/3284* (2013.01); *C04B 2235/767* (2013.01)

(58) Field of Classification Search
CPC ........ G11B 5/00; G11B 5/70678; H01F 1/11; C04B 2235/3206; C04B 2235/3208; C04B 2235/3213; C04B 2235/3215; C04B 2235/3224; C04B 2235/3227; C04B 2235/3232; C04B 2235/3244; C04B 2235/3262; C04B 2235/3275; C04B 2235/3281; C04B 2235/3284; C04B 2235/767; C04B 35/26; C04B 35/2633; H05K 9/0081
USPC ..................... 252/62.54, 62.56, 62.59, 62.63; 428/900
See application file for complete search history.

(56) References Cited

U.S. PATENT DOCUMENTS

| | | | |
|---|---|---|---|
| 4,636,433 A | 1/1987 | Kubo et al. | |
| 4,797,331 A * | 1/1989 | Watada et al. | ............. 428/822.1 |
| 2004/0251997 A1 | 12/2004 | Morel et al. | |
| 2006/0145118 A1* | 7/2006 | He et al. | ..................... 252/62.59 |

FOREIGN PATENT DOCUMENTS

| | | |
|---|---|---|
| CN | 1321321 A | 11/2001 |
| CN | 1571761 A | 1/2005 |
| EP | 0183988 A2 | 6/1986 |
| EP | 1126480 A1 * | 8/2001 |
| GB | 2183413 A | 6/1987 |
| JP | 62252325 A | 11/1987 |
| JP | 7-40380 B2 | 5/1995 |
| JP | 11354972 A | 12/1999 |
| JP | 2001-057305 A | 2/2001 |
| JP | 200176918 A | 3/2001 |
| JP | 2006-104050 A | 4/2006 |
| JP | 2009-290075 A | 12/2009 |
| JP | 2010260766 A | 11/2010 |

OTHER PUBLICATIONS

Extended European Search Report issued Jul. 9, 2014, corresponds to European patent application No. 14153329.9.
Praveen Singh et al., "Dielectric constant, magnetic permeability and microwave absorption studies of hot-pressed Ba—CoTi hexaferrite composites in X-band", Journal of materials science, Kluwer academic publishers, Bo, vol. 41, No. 21, Oct. 18, 2006, pp. 7190-7196, XP019450967.
Li Z W et al., "Studies of static and high-frequency magnetic properties for M-type ferrite BaFe12-2xCoxZrxO19", Journal of applied physics, American institute of physics, US, vol. 92, No. 7, Oct. 1, 2002, pp. 3902-3907, XP012057363.
Roberto Da et al., "Effect of double substituted m-barium hexaferrites on microwave absorption properties", Materials Science—Poland, Jan. 1, 2004, XP55124830.
Office Action mailed Oct. 14, 2014, corresponding to Japanese patent application No. 2013-073805.
Office Action mailed May 20, 2014, corresponds to Japanese patent application No. 2013-073805.
Zhang Lei, Study of microwave absorbing properties of Sr1-xLaxCo0.3Ti0.3Fe11.4O19 ferrite, Dec. 2010.
Toshio Kagotani et al., Enhancement of Microwave Absorption Characteristics in Allgned M-type Barium Ferrite Ba1-xLaxZnxFe12-x-y(Me0.5Mn0.5)yO19 (x=0.0-0.5, Me:Sn, Zr, y=1.0-3.0) by Metal Substitution, 2004.

* cited by examiner

*Primary Examiner* — Jonathan Johnson
*Assistant Examiner* — Lynne Edmondson
(74) *Attorney, Agent, or Firm* — Hauptman Ham, LLP

(57) ABSTRACT

An object of the present invention is to provide, in order to deal with a high frequency band in which radio waves are expected to be increasingly used hereafter, a magnetoplumbite-type hexagonal ferrite material having significantly improved high-frequency property of magnetic permeability. Specifically, a magnetoplumbite-type hexagonal ferrite is represented by a composition formula: $A_{(1-x)}B_xC_x(D1_yD2_y)Fe_{(12-x-2y)}O_{19}$ (where x: 0.1 to 0.3, y:0.1 to 0.5), wherein A is any one of $Ba^{2+}$, $Sr^{2+}$ and $Ca^{2+}$, B is any one of $La^{3+}$ and $Nd^{3+}$, C and D1 are any one or more of $Co^{2+}$, $Mn^{2+}$, $Mg^{2+}$, $Zn^{2+}$, $Cu^{2+}$ and $Ni^{2+}$, and D2 is any one of $Ti^{4+}$ and $Zr^{4+}$.

4 Claims, No Drawings

MAGNETOPLUMBITE-TYPE HEXAGONAL FERRITE

RELATED APPLICATIONS

The present application claims priority to Japanese Application No. 2013-073805, filed on Mar. 29, 2013, the disclosure of which is hereby incorporated by reference herein in its entirety.

TECHNICAL FIELD

The present invention relates to a magnetoplumbite-type hexagonal ferrite material having an excellent noise suppression effect in a band exceeding 5 GHz.

BACKGROUND ART

In recent years, advancement in semiconductor technology has been allowing a marked development of high-speed communication technology for mobile phones, personal computers, TVs and the like and also of high integration technology of communication equipments. Also, following advancement of information communication technology, in-circuit signals of electronic equipments and communication equipments in a low frequency band have been substituted by in-circuit signals in a high frequency band, and thus a circumstance has been changed to use electromagnetic waves in various frequency bands. On the other hand, integration of systems and diversification of used frequency bands have been making surrounding electromagnetic wave environments severe every day. For example, there has been a problem that, due to the system integration, many systems that have originally been independent from each other become in proximity to each other, causing interference with each other with electromagnetic waves transmitted therefrom and thereby inflicting dysfunction. In order to solve this problem, although electromagnetic compatibility (EMC) during a product designing phase or a development phase has been required, it has been difficult to solve the problem of electromagnetic interference described above by means of the semiconductor technology alone.

Therefore, as one of measures against the problem of electromagnetic wave interference described above, a noise suppression sheet made of rubber or resin having magnetic material dispersed therein have been widely used. As the magnetic material for the noise suppression sheet, soft magnetic materials such as mainly metallic material and ferrite material have been used. As the metallic material, permalloy, amorphous and sendust are popularly used, and Ni—Zn ferrite and garnet ferrite are popularly used as the ferrite material. Heretofore, since the electromagnetic wave interference problem has been lying mostly in a range between a MHz band and a several GHz (3 GHz or so) band, the noise suppression sheets using existing magnetic materials (permalloy, sendust, Ni—Zn ferrite and the like) that exhibit high magnetic permeability in the above band were capable of dealing with the problem.

However, recent increase in use of a frequency band over 1 GHz, especially a frequency band over 5 GHz, associated with high-speeding of information communication technology has been leading to the advocacy of the electromagnetic wave interference problems in these bands. It is difficult to obtain a sufficient electromagnetic wave suppressing effect by using the noise suppression sheets using existing magnetic materials against noise at these frequencies.

For example, PLT 1 describes that, by controlling complex magnetic permeability and volume resistivity value of Ni—Zn ferrite, a noise suppression sheet that reflects less amount of radio waves of frequencies at 10 MHz to 1 GHz and has a large electromagnetic wave absorption may be provided. Indeed, Ni—Zn ferrite, because of its high complex magnetic permeability in the MHz band, is often used as a magnetic material having high noise suppression effect in the MHz band. However, the magnetic permeability sharply decreases at 1 GHz and becomes approximately 1 as a real part and 0 as an imaginary part at 5 GHz. For that reason, Ni—Zn ferrite may be considered as an unusable magnetic material from the viewpoint of noise suppression in the GHz band, for which there has been increasing demand in recent years. Further, most of other materials used as the magnetic material of the noise suppression sheet have high noise suppression effect between the MHz band and a several GHz (around 3 GHz) and, under the present circumstances, there is as yet no magnetic material that aims at the band over 5 GHz.

In view of the above, there is a need for a material that, unlike the conventional magnetic materials that exhibit high magnetic permeability in the MHz band, has high magnetic permeability in a GHz band. As a material that is expected to have such property, magnetoplumbite-type hexagonal ferrite that exhibits magnetic resonance in the GHz band may be mentioned. Magnetoplumbite-type hexagonal ferrite is a hard magnetic material and thus has been used as a permanent magnet, and there still are a number of researches to enhance its magnetic property. As an example of leading studies, there is element substitution. This is a method, by substituting some elements composing magnetoplumbite-type hexagonal ferrite with other elements, to improve initial magnetic permeability and coercive force, thereby enhancing performance as a magnet.

Regarding magnetoplumbite-type hexagonal ferrite, PLT 2 and PLT 3 have descriptions that magnetoplumbite-type hexagonal ferrite having various substituted elements may be used as a material having both high magnetic flux density and high coercive force and thus has improved performance as a magnet.

CITATION LIST

Patent Literature

PLT 1: JP 2009-290075 A
PLT 2: JP 2006-104050 A
PLT 3: JP 2001-57305 A

SUMMARY OF INVENTION

Technical Problem

As shown in PLT 2 and PLT 3, required properties as a magnet are indeed the magnetic flux density and the coercive force. However, required properties as the material of the noise suppression sheet described above are high magnetic permeability and a high imaginary component $\mu''$ of the complex magnetic permeability (hereinafter, also referred to as magnetic permeability $\mu''$) at a high resonant frequency. Especially, the noise suppression sheet applicable to the GHz band targeted by the present invention needs to exhibit the magnetic resonance in the GHz band. However, magnetoplumbite-type hexagonal ferrite formulated as a magnet according to conventional techniques has been leaving a problem of having difficulty in exhibiting the magnetic resonance in the GHz band unsolved.

The present invention, aiming to solve the problem described above, for a usage not as a magnet but as a noise suppression means against the band over 5 GHz, focused on a high resonant frequency of magnetoplumbite-type hexagonal ferrite (hereinafter, also referred to as M-type hexagonal ferrite).

Solution to Problem

That is, M-type hexagonal ferrite has high magnetocrystalline anisotropy and an easy magnetization direction along a c-axis. Also, because of the high magnetocrystalline anisotropy, the coercive force of M-type hexagonal ferrite is as high as 3000 to 4000 Oe. Thus, M-type hexagonal ferrite has been widely used as a permanent magnet as a hard magnetic material. Accordingly, a value of initial magnetic permeability indicating a soft magnetic property is as small as 2 to 3, and the magnetic permeability $\mu"$ directly linked to the noise suppression effect is as small as 0.1 to 0.5 even at the resonant frequency. However, M-type hexagonal ferrite, as described below, is expected to have a significantly improved performance.

Incidentally, magnetic materials are considered to follow Snoek's product (GHz: initial magnetic permeability×resonant frequency), where the initial magnetic permeability and the resonant frequency are inversely proportional to each other. A value of Snoek's product is considered to be one of indicators of performance of a high frequency magnetic material and, the larger the value is, higher high-frequency property is. General ferrite having a cubic crystalline structure (spinel-type ferrite such as Ni—Zn ferrite and Mn—Zn ferrite) has no magnetocrystalline anisotropy. For the material having no magnetocrystalline anisotropy, Snoek's product, i.e., the product of the initial magnetic permeability and the resonant frequency, is constant and thus either the initial magnetic permeability or the resonant frequency is small. Ni—Zn ferrite as spinel-type ferrite has Snoek's product of 5.6 GHz. On the other hand, unlike spinel-type ferrite, M-type hexagonal ferrite used in the present invention is in the shape of a hexagonal plate and thus has crystallographic anisotropy. Changing the value of the anisotropy (anisotropy along the c-axis, anisotropy along a c-plane) allows variation of a maximum value of Snoek's product. That is, M-type hexagonal ferrite which exhibits magnetic resonance in the GHz band and has high magnetic permeability $\mu"$ to achieve the noise suppression effect may be obtained.

The present invention has been made based on the novel findings described above, and a summary thereof is as follows.

(1) Magnetoplumbite-type hexagonal ferrite represented by a composition formula: $A_{(1-x)}B_xC_x(D1_yD2_y)Fe_{(12-x-2y)}O_{19}$ (where x: 0.1 to 0.3, y: 0.1 to 0.5), wherein, in the composition formula, A is any one of $Ba^{2+}$, $Sr^{2+}$ and $Ca^{2+}$, B is any one of $La^{3+}$ and $Nd^{3+}$, C and D1 are any one or more of $Co^{2+}$, $Mn^{2+}$, $Mg^{2+}$, $Zn^{2+}$, $Cu^{2+}$ and $Ni^{2+}$, and D2 is any one of $Ti^{4+}$ and $Zr^{4+}$.

(2) The magnetoplumbite-type hexagonal ferrite according to the aforementioned (1), wherein, in the composition formula, A is $Ba^{2+}$ or $Sr^{2+}$, B is $La^{3+}$, C and D1 are any one or two of $Co^{2+}$ and $Zn^{2+}$, and D2 is $Ti^{4+}$.

(3) The magnetoplumbite-type hexagonal ferrite according to the aforementioned (1) or (2), having a resonant frequency at 10 GHz or higher, wherein an imaginary component $\mu"$ of complex magnetic permeability at the resonant frequency is 3 or more.

The composition formula described above is characterized in that, first, $Fe^{3+}$ site is substituted by, for example, ($Co^{2+}$ and $Ti^{4+}$) or ($Zn^{2+}$ and $Ti^{4+}$). Such a substitution reduces large coercive force of the M-type hexagonal ferrite down to 100 Oe or less, thereby altering hard magnetism to soft magnetism. To that end, it is necessary to reduce the coercive force by suppressing magnetic anisotropy of M-type hexagonal ferrite directed along the c-axis. As components for suppressing an anisotropic magnetic field as described above, Co, Zn and the like may be mentioned. That is, the substitution of the $Fe^{3+}$ site forming M-type hexagonal ferrite with, for example, $Co^{2+}$ allows improvement of magnetocrystalline anisotropy because of an easy magnetization direction of $Co^{2+}$ into the c-plane direction and an easy magnetization direction of $Fe^{3+}$ along the c-axis. As a result, the coercive force is reduced and the alteration to the soft magnetism is achieved. Further, although Co has smaller magnetic moment than Fe, Co does not decrease saturation magnetization of ferrite to a certain ratio and thus can maintain the saturation magnetization. However, the addition of Co exceeding an amount allowing solid dissolution significantly reduces the saturation magnetization, accompanying which an absolute value of the magnetic permeability also decreases.

Next, the addition of Ti has a role to increase density of a sintered compact in sintering production and a size of a crystal grain. Here, the size of the crystal grain is closely related to the coercive force; larger the crystal grain is, greater the coercive force is. As such, the increase in the size of the crystal grain by the addition of Ti has a role to reduce the coercive force.

Next, substitution of a part of Ba site with La may cause distortion of an overall crystal lattice because Ba serves as a core of the crystal lattice. Thereby, a substitution amount of Fe site may be controlled to be smaller. At this time, having the x in the composition formula between 0.1 and 0.3 allows to keep y substituting the Fe site 0.5 or less.

As described above, since substitution of a part of the Ba site with La causes the crystal structure to be distorted, the addition of elements in an amount exceeding an upper limit of y in the composition formula hinders the added elements from being fully solid-dissolved in M-type hexagonal ferrite, generating precipitates of impure products that are not M-type hexagonal ferrite. Since the precipitates include non-magnetic substances as well, the absolute value of the magnetic permeability decreases compared to single-phased M-type hexagonal ferrite. Thus, y is set to 0.5 or less.

Advantageous Effect of Invention

According to the present invention, high-frequency property of the magnetic permeability of M-type hexagonal ferrite may be dramatically improved, whereby an optimum material for a noise suppression sheet corresponding to a high frequency band, radio waves of which is expected to be used increasingly, may be provided.

DESCRIPTION OF EMBODIMENTS

The present invention is magnetoplumbite-type hexagonal ferrite in accordance with a composition formula: $A_{(1-x)}B_xC_x(D1_yD2_y)Fe_{(12-x-2y)}O_{19}$. The following is a detailed description of the composition formula.

The A in the composition formula represents an element having an ionic radius as large as that of oxygen ions which is, specifically, any one of $Ba^{2+}$, $Sr^{2+}$ and $Ca^{2+}$. Preferably, the A represents one of $Ba^{2+}$ and $Sr^{2+}$ having the ionic radius closer to that of oxygen ions. When $Ba^{2+}$ or $Sr^{2+}$ substitutes for a part of oxygen ion forming hexagonal closest packing and $Fe^{3+}$ enters a sub-lattice point of each coordination (octahedron, tetrahedron, pseudo-tetrahedron), $Ba^{2+}$ or $Sr^{2+}$ underlies the hexagonal ferrite. Various kinds of hexagonal ferrite are formed by combinations of basic structures.

A mixing amount of the substitution element A may be represented by 1-x (here, x: 0.1 to 0.3), i.e., 0.7 to 0.9. This is because, with the substitution element A in an amount less than 0.7, a hexagonal ferrite structure itself may not be formed. On the other hand, when 1-x exceeds 0.9, an effect of B for later substitution may not be obtained.

The substitution element B in the composition formula is one of $La^{3+}$ and $Nd^{3+}$ that are rare earth elements having ionic radii close to those of $Ba^{2+}$, $Sr^{2+}$ and $Ca^{2+}$. Preferably, the substitution element B is $La^{3+}$ having the ionic radius closest to those of $Ba^{2+}$, $Sr^{2+}$ and $Ca^{2+}$. The reason for using the substitution element B having the ionic radius close to those of $Ba^{2+}$, $Sr^{2+}$ and $Ca^{2+}$ is that, when the ion radii of the elements A and B are significantly different from one another, ion energy is also significantly different from one another, thus causing trouble in substitution. Since the substitution element A serves as a core of magnetoplumbite-type hexagonal ferrite, substitution of a part of the substitution element A with $La^{3+}$ or $Nd^{3+}$ can alter spacing of a crystal lattice of the entire ferrite. This effect relates to a substitution amount of Fe site described below, and thus description thereof is omitted here.

Further, when Ba site, Sr site or Ca site, which are divalent, is substituted by a trivalent element La or Nd, an electroneutrality condition is disturbed. In order to compensate for it, it is advantageous to substitute the Fe site, which is trivalent, with a divalent element as a substitution element C in the composition formula, thereby maintaining electroneutrality. Thus, magnetoplumbite-type hexagonal ferrite having stable properties may be provided. Note that the substitution element C is any one or more of $Co^{2+}$, $Mn^{2+}$, $Mg^{2+}$, $Zn^{2+}$, $Cu^{2+}$ and $Ni^{2+}$.

Here, x in relation to the substitution element B in the composition formula is within a range of 0.1 to 0.3. This is because, when x is less than 0.1, a sufficient force to alter the spacing of the crystal lattice may not be provided, making the addition rather pointless. On the other hand, when x exceeds 0.3, the excess of the added element may not be solid-dissolved in M-type hexagonal ferrite and generates impurities, thereby sharply decreasing saturation magnetization of the material and also reducing an absolute value of magnetic permeability. Further, since the substitution element C is used for substitution to maintain electroneutrality as described above, the substitution amount of C is equivalent to x of the substitution element B.

The substitution element D1 in the composition formula needs to be an element that is expected to lower the magnetocrystalline anisotropy (coercive force) of M-type hexagonal ferrite and also to have an effect of altering hard magnetism to soft magnetism. As such, an easy magnetization direction (magnetic anisotropy) of M-type hexagonal ferrite along a c-axis needs to be reduced (pulled to a c-plane direction). As an element capable of turning the easy magnetization direction to the c-plane direction, any one or more of $Co^{2+}$, $Mn^{2+}$, $Mg^{2+}$, $Zn^{2+}$, $Cu^{2+}$ and $Ni^{2+}$ are used. By substituting the Fe site forming M-type hexagonal ferrite with Co, Zn or the like, the easy magnetization direction of Co, Zn or the like and the easy magnetization direction of Fe cancel each other, thereby improving magnetocrystalline anisotropy. As a result, the coercive force is reduced, and the alteration to the soft magnetism is achieved.

The substitution element D1 substitutes the Fe site, which is trivalent, with Co and/or Zn, which are divalent. Thus, in a manner similar to the above, electroneutrality is disturbed. In order to compensate for it, accordingly, it is essential to substitute with a tetravalent element as the substitution element D2 in the composition formula so as to maintain electroneutrality. Thereby, M-type hexagonal ferrite with stable properties may be provided. The tetravalent element may be Ti, Zr, Hf and the like. In particular, Ti and/or Zr are preferable, because the addition thereof functions to increase density of a sintered compact in sintering production and, also, to increase the size of the crystal grain.

The value of y in the composition formula needs to be within a range of 0.1 to 0.5. That is, when y is less than 0.1, neither the alteration of the easy magnetization direction by the addition of the Co element nor the increase in the density and the size of the crystal grain caused by Ti and/or Zr cannot occur. Accordingly, improvement in the magnetic permeability cannot be expected. On the other hand, when y is more than 0.5, Ti and/or Zr cannot be fully solid-dissolved in the M-type hexagonal ferrite and impurities are generated, thereby sharply decreasing the saturation magnetization of the material and reducing the absolute value of the magnetic permeability.

Incidentally, in order to improve the magnetic permeability of $BaFe_{12}O_{19}$, the Fe site is substituted by Co and Ti in a manner similar to the present invention. Thereby, magnetic resonance may be exhibited at a practical frequency and, also, high magnetic permeability promising the noise suppression effect may be obtained. A composite formula is represented by: $Ba(CoTi)_xFe_{(12-x)}O_{19}$, where x is 1.0 to 2.0.

According to the present invention, however, with a substitution amount of Co and Ti equal to or less than 0.5, a material having magnetic permeability property equal to or higher than that of conventional materials may be obtained. This is because, since substitution of the Ba site or the Sr site serving as the core of M-type hexagonal ferrite with La may cause distortion of the lattice of the entire crystal, a great substitution effect may be obtained with only a small amount of Co, and, Ti or Zr.

Note that M-type hexagonal ferrite of the present invention may be produced according to a typical ferrite production method. For example, powders of oxide or carbonate of the elements as raw materials are respectively weighed to form a desired composition of magnetoplumbite-type hexagonal ferrite. Next, a mixture of the powders is kneaded in a wet ball mill for 24 hours. By molding resulting kneaded powder in a press molding and calcining the resulting material in the atmosphere at 800° C. to 1400° C. for 1 to 10 hours, desired M-type hexagonal ferrite may be obtained.

EXAMPLES

The following is a detailed description of the present invention. Examples show presence of a single-phase formation according to X-ray diffraction of a resulting material, a frequency at which the magnetic resonance is exhibited and the magnetic permeability μ" at the frequency according to a material constant evaluation.

Example 1

As raw material powders, $La_2O_3$, $BaCO_3$, $\alpha$-$Fe_2O_3$, $TiO_2$ and CoO were used. These powders were weighed in substitution amounts corresponding to the following composition.

Note

Composition formula: $Ba_{(1-x)}La_xCo_x(Co_yTi_y)Fe_{(12-x-2y)}O_{19}$

Substitution amounts: x=0.2, y=0.2

Subsequently, the weighed raw material powders were kneaded in the wet ball mill for 24 hours and then dried, whereby kneaded powder was obtained. The obtained kneaded powder was subjected to press-molding to be molded into pellets, and thus obtained compacts were calcined in an electric furnace. A calcination condition is 1300° C. in the atmosphere for 5 hours. Thus obtained sintered bodies, for the material constant evaluation, were processed into a toroidal shape having an outer diameter of 7 mm, an inner diameter of 3 mm and a thickness of 1.5 mm. Also, for crystal identification (X-ray diffraction), the sintered bodies were ground in a planetary ball mill for 1 hour into powder.

By using thus obtained sintered bodies of M-type hexagonal ferrite in the toroidal shape and powder thereof, evaluation of the magnetic permeability property and identification of a crystal structure according to the X-ray diffraction were conducted. Results are shown in Table 1.

Example 2

As raw material powders, $La_2O_3$, $SrCO_3$, $\alpha$-$Fe_2O_3$, $TiO_2$ and CoO were used. These powders were weighed in substitution amounts corresponding to the following composition.

Note

Substitution amounts: x=0.2, y=0.2

The same condition of the process for obtaining the sintered bodies from the weighted raw material powders as the above Example 1 was applied. By using the obtained sintered bodies in the toroidal shape and powder thereof, the evaluation of the magnetic permeability property and the identification of the crystal structure according to the X-ray diffraction were conducted in a manner similar to Example 1. Results are shown in Table 1.

Example 3

As raw material powders, $La_2O_3$, $SrCO_3$, $\alpha$-$Fe_2O_3$, $TiO_2$ and ZnO were used. These powders were weighed in substitution amounts corresponding to the following composition.

Note

Substitution amounts: x=0.2, y=0.2

The same condition of the process for obtaining the sintered bodies from the weighted raw material powders as the above Example 1 was applied. By using the obtained sintered bodies in the toroidal shape and powder thereof, the evaluation of the magnetic permeability property and the identification of the crystal structure according to the X-ray diffraction were conducted in a manner similar to Example 1. Results are shown in Table 1.

Example 4

The same raw material powders as Example 1 were used, and these powders were weighed in substitution amounts corresponding to the following composition.

Note

Substitution amounts: x=0.2, y=0.3

The same condition of the process for obtaining the sintered bodies from the weighted raw material powders as the above Example 1 was applied. By using the obtained sintered bodies in the toroidal shape and powder thereof, the evaluation of the magnetic permeability property and the identification of the crystal structure according to the X-ray diffraction were conducted in a manner similar to Example 1. Results are shown in Table 1.

Example 5

As raw material powders, $La_2O_3$, $SrCO_3$, $\alpha$-$Fe_2O_3$, $ZrO_2$ and CoO were used. These powders were weighed in substitution amounts corresponding to the following composition.

Note

Substitution amounts: x=0.2, y=0.2

The same condition of the process for obtaining the sintered bodies from the weighted raw material powders as the above Example 1 was applied. By using the obtained sintered bodies in the toroidal shape and powder thereof, the evaluation of the magnetic permeability property and the identification of the crystal structure according to the X-ray diffraction were conducted in a manner similar to Example 1. Results are shown in Table 1.

Comparative Example 1

In Comparative Example 1, a sample was produced by using the raw material powders, composition formula and production procedure that are the same as Example 1 with altered substitution amounts. That is, the substitution amounts are: x=0.4, y=0.2, i.e., x was out of the range of the present invention. By using obtained sintered bodies in the toroidal shape and powder thereof, the evaluation of the magnetic permeability and the identification of the crystal structure according to the X-ray diffraction were conducted in a manner similar to Example 1. Results are shown in Table 1.

Comparative Example 2

In Comparative Example 2, a sample was produced by using the raw material powders, composition formula and production procedure that are the same as Example 1 with altered substitution amounts. That is, the substitution amounts are: x=0.4, y=0.6, i.e., y was out of the range of the present invention. By using obtained sintered bodies in the toroidal shape and powder thereof, the evaluation of the magnetic permeability and the identification of the crystal structure according to the X-ray diffraction were conducted in a manner similar to Example 1. Results are shown in Table 1.

Comparative Example 3

In Comparative Example 3, a sample was produced by using the raw material powders, composition formula and production procedure that are the same as Example 1 with altered substitution amounts. That is, the substitution amounts are: x=0.4, y=0.6, i.e., both x and y were out of the ranges of the present invention. By using obtained sintered bodies in the toroidal shape and powder thereof, the evaluation of the magnetic permeability and the identification of the crystal structure according to the X-ray diffraction were conducted in a manner similar to Example 1. Results are shown in Table 1.

Comparative Example 4

In Comparative Example 4, a sample was produced by using the raw material powders, composition formula and production procedure that are the same as Example 1 with altered substitution amounts. That is, the substitution amounts are: x=0.05, y=0.05, i.e., both x and y were out of the ranges of the present invention. By using obtained sintered bodies in the toroidal shape and powder thereof, the evaluation of the magnetic permeability and the identification of the crystal structure according to the X-ray diffraction were conducted in a manner similar to Example 1. Results are shown in Table 1.

Comparative Example 5

As raw material powders, $BaCO_3$, $\alpha$-$Fe_2O_3$, $TiO_2$ and CoO were used. These powders were weighed in substitution amounts corresponding to the following composition. Note that the production procedure was similar to that of Example 1.

Note

Composition formula: $Ba(CoTi)_xFe_{(12-2x)}O_{19}$
Substitution amount: x=1.0
By using thus obtained sintered bodies in the toroidal shape and powder thereof, the evaluation of the magnetic permeability property and the identification of the crystal structure according to the X-ray diffraction were conducted in a manner similar to Example 1. Results are shown in Table 1.

Comparative Example 6

As raw material powders, $La_2O_3$, $BaCO_3$, $\alpha$-$Fe_2O_3$, $HfO_2$ and CoO were used. These powders were weighed in substitution amounts corresponding to the following composition. Note that the production procedure was the similar to that of Example 1.

Note

Composition formula: $Ba_{(1-x)}La_xCo_x(Co_yHf_y)Fe_{(12-x-2y)}O_{19}$

Substitution amounts: x=0.2, y=0.2

By using thus obtained sintered bodies in the toroidal shape and powder thereof, the evaluation of the magnetic permeability property and the identification of the crystal structure according to the X-ray diffraction were conducted in a manner similar to Example 1. Results are shown in Table 1.

TABLE 1

| | Composition | Generation of Single-Phase | Resonant Frequency | Magnetic Permeability at Resonance ($\mu''$) |
|---|---|---|---|---|
| Example 1 | $Ba_{0.8}La_{0.2}Co_{0.4}Ti_{0.2}Fe_{11.4}O_{19}$ | Yes | 15 GHz | 3.5 |
| Example 2 | $Sr_{0.8}La_{0.2}Co_{0.4}Ti_{0.2}Fe_{11.4}O_{19}$ | Yes | 15 GHz | 3.4 |
| Example 3 | $Ba_{0.8}La_{0.2}Zn_{0.4}Ti_{0.2}Fe_{11.4}O_{19}$ | Yes | 15 GHz | 3.1 |
| Example 4 | $Ba_{0.8}La_{0.2}Co_{0.5}Ti_{0.3}Fe_{11.2}O_{19}$ | Yes | 12 GHz | 3.6 |
| Example 5 | $Ba_{0.8}La_{0.2}Co_{0.4}Zr_{0.2}Fe_{11.4}O_{19}$ | Yes | 14 GHz | 3.1 |
| Comparative Example 1 | $Ba_{0.6}La_{0.4}Co_{0.6}Ti_{0.2}Fe_{11.2}O_{19}$ | No | 10 GHz | 2.2 |
| Comparative Example 2 | $Ba_{0.8}La_{0.2}Co_{0.8}Ti_{0.6}Fe_{10.2}O_{19}$ | No | 8 GHz | 2.5 |
| Comparative Example 3 | $Ba_{0.6}La_{0.4}Co_{1.0}Ti_{0.6}Fe_{10.4}O_{19}$ | No | —(*) | 0 |
| Comparative Example 4 | $Ba_{0.95}La_{0.06}Co_{0.1}Ti_{0.06}Fe_{11.85}O_{19}$ | Yes | —(*) | 0 |
| Comparative Example 5 | $Ba(CoTi)_{1.0}Fe_{10.0}O_{19}$ | Yes | 15 GHz | 2.5 |
| Comparative Example 6 | $Ba_{0.8}La_{0.2}Co_{0.4}Hf_{0.2}Fe_{11.4}O_{19}$ | Yes | 15 GHz | 1.0 |

NB: The asterisk (*) in the table denotes no resonance observed in the measured frequency range (0.5 GHz to 18 GHz).

As shown in Table 1, Example 1 demonstrated that, according to the X-ray diffraction, M-type hexagonal ferrite was of a single-phase. Also, measurement of the magnetic permeability in a range of frequencies at 1 GHz to 18 GHz indicated that the resonant frequency was shifted from a frequency band of 30 GHz or more to 15 GHz and that the magnetic permeability $\mu''$ at the resonant frequency rose to 3.5.

Similarly, in Example 2 altering Ba to Sr in the composition formula of Example 1, the resonant frequency was shifted to be lower and a similar result was obtained.

In Example 3 altering Co to Zn in the composition formula of Example 1, the magnetic permeability slightly decreased compared to Example 1. Nonetheless, the magnetic permeability was still higher than that of conventional M-type ferrite. A conjectured reason for the decrease in the magnetic permeability compared to that of Example 1 is because of presence of magnetization of the substitution element itself. That is, Co has magnetization per se, whereas Zn does not. This difference is considered to have emerged as difference of the magnetic permeability.

In Example 4, although the resonant frequency was shifted to be lower compared to Example 1, the magnetic frequency $\mu''$ at the resonant frequency was 3.6, which is higher than Example 1. This is considered as a result according to Snoek's product.

In Example 5 altering Ti to Zr in the composition formula of Example 1, the magnetic permeability slightly decreased compared to Example 1. Nonetheless, the magnetic permeability was still higher than that of conventional M-type ferrite. A conjectured reason for the lower magnetic permeability than Example 1 is because Ti has higher sinter promoting property and thus a sintered body with high density was obtained.

On the other hand, Comparative Example 1 demonstrated that, according to the X-ray diffraction, M-type hexagonal ferrite was of non-single-phase. Also, when the magnetic permeability was measured at frequencies in a range of 1 GHz to 18 GHz, an increase in the magnetic permeability $\mu"$ by the magnetic resonance was observed at 10 GHz. However, since this M-type hexagonal ferrite contained impurity (non-single-phase), the value of the magnetic permeability was very small compared to Example 1. A similar result was obtained in Comparative Example 2.

As for Comparative Example 3, the magnetic resonance was not observed in a measurement range of the magnetic permeability, and the value of the magnetic permeability $\mu"$ was nearly 0. It is inferred that these results of Comparative Examples 1 to 3 were led by, due to generation of a large amount of impurities that are not M-type hexagonal ferrite having the magnetic property, a decrease in the saturation magnetization of the sintered bodies themselves accompanied by a decrease in the absolute value of the magnetic permeability.

Comparative Example 4 demonstrated that the M-type hexagonal ferrite was of single-phase. When the magnetic permeability was measured, however, no increase in the magnetic permeability $\mu"$ by the magnetic resonance in the measured range was observed. A conjectured reason for that is because, due to the very small substitution amount, the resonant frequency was 18 GHz or higher. In addition, the value of the magnetic permeability itself was small.

In Comparative Example 5, the M-type hexagonal ferrite was of single-phase, and the resonant frequency was 15 GHz. The magnetic permeability at the resonant frequency was 2.5, which is comparatively high. However, the magnetic permeability is smaller compared to Example 1 substituting Ba site with La, and the substitution amount was large. Accordingly, it is considered that stable production of this M-type hexagonal ferrite may be difficult.

In Comparative Example 6, the M-type hexagonal ferrite was of single-phase similar to the case in which Ti was substituted, and the resonant frequency was 15 GHz. However, the magnetic permeability at the resonant frequency was 1.0, which is not a particularly large value. A conjectured reason is that, unlike Ti, Hf does not have a function to increase the density of the sintered body in sintering production and also to increase the size of the crystal grain, leading to a low proportion of the magnetic material to a volume.

What is claimed is:

1. Magnetoplumbite-type hexagonal ferrite represented by a composition formula: $A_{(1-x)}B_xC_x(D1_yD2_y)Fe_{(12-x-2y)}O_{19}$, x being 0.1 to 0.3 and y being 0.1 to 0.5, wherein, in the composition formula, A is any one of $Ba^{2+}$, $Sr^{2+}$ and $Ca^{2+}$, B is any one of $La^{3+}$ and $Nd^{3+}$, C and D1 are any one or more of $Co^{2+}$, $Mn^{2+}$, $Mg^{2+}$, $Zn^{2+}$, $Cu^{2+}$ and $Ni^{2+}$, and D2 is any one of $Ti^{4+}$ and $Zr^{4+}$, and the ferrite has a coercive force of 100 Oe or less.

2. The magnetoplumbite-type hexagonal ferrite according to claim 1, wherein, in the composition formula, A is $Ba^{2+}$ or $Sr^{2+}$, B is $La^{3+}$, C and D1 are any one or two of $Co^{2+}$ and $Zn^{2+}$, and D2 is $Ti^{4+}$.

3. The magnetoplumbite-type hexagonal ferrite according to claim 1, having a resonant frequency at 10 GHz or higher, wherein an imaginary component $\mu"$ of complex magnetic permeability at the resonant frequency is 3 or more.

4. The magnetoplumbite-type hexagonal ferrite according to claim 2, having a resonant frequency at 10 GHz or higher, wherein an imaginary component $\mu"$ of complex magnetic permeability at the resonant frequency is 3 or more.

* * * * *